United States Patent
Gogl (10) Patent No.: US 7,391,639 B2
(45) Date of Patent: Jun. 24, 2008

(54) MEMORY DEVICE AND METHOD FOR READING DATA

(75) Inventor: Dietmar Gogl, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 310 days.

(21) Appl. No.: 11/354,281

(22) Filed: Feb. 14, 2006

(65) Prior Publication Data

US 2007/0189059 A1 Aug. 16, 2007

(51) Int. Cl.
*G11C 11/00* (2006.01)
(52) U.S. Cl. ............... 365/148; 365/163; 365/205; 365/185.25
(58) Field of Classification Search ........... 365/148, 365/163, 205, 185.25
See application file for complete search history.

(56) References Cited

U.S. PATENT DOCUMENTS

| | | | |
|---|---|---|---|
| 6,462,998 B1 * | 10/2002 | Proebsting | 365/205 |
| 7,239,562 B2 * | 7/2007 | Takemura | 365/189.08 |
| 2003/0128612 A1 | 7/2003 | Moore et al. | |
| 2006/0067147 A1 * | 3/2006 | Roehr | 365/207 |
| 2007/0159870 A1 * | 7/2007 | Tanizaki et al. | 365/148 |

* cited by examiner

*Primary Examiner*—Tuan T. Nguyen
(74) *Attorney, Agent, or Firm*—Dicke, Billig, Czaja PLLC (57) ABSTRACT

A memory with memory cells, wherein a memory cell includes a resistive element and a switch, wherein the memory cells are connected with a common plate line and with respective bit lines, wherein the common plate line supplies a plate voltage, wherein the switches include control inputs that are connected with word lines for controlling the switching states, wherein the word lines are connected with a word line driver that supplies selected word lines with a voltage, wherein the bit lines are connected with second switches, wherein the first bit lines are connectable by respective second switches with a first voltage level and the second bit lines are connectable by respective second switches with a second voltage level, wherein a first and a second bit line are connectable as a bit line pair with a sense amplifier, wherein the sense amplifier amplifies a voltage difference between the first and the second bit line of the bit line pair, wherein the resistive element is able to change the resistance depending on an electrical voltage that is applied across the resistive element, and wherein the second voltage level is between the plate voltage level and the first voltage level.

19 Claims, 4 Drawing Sheets

MEMORY DEVICE AND METHOD FOR READING DATA

BACKGROUND OF THE INVENTION

1. Field of the Invention

The invention relates to a memory device with memory cells comprising a resistive element and a selective switch and a method for reading a datum from a memory cell of a memory device comprising a resistive element.

2. Description of the Related Art

Memory cells with resistive elements and a selective switch, having for example, a solid electrolyte material as a resistive material, are well known as programmable metallization cells (PMC). Memory device including such PMC memory cells are known as conductive-bridging random access memory (CBRAM). The storing of different states in a PMC memory cell is based on the developing or diminishing of a conductive path in the electrolyte material between electrodes based on an applied electric field. Since the electrolyte material has a high resistance and the conductive path between electrodes has a low resistance, the PMC memory cell can be set to different states depending on the resistance of the PMC memory element. Usually, both states of the PMC memory cell are sufficiently time-stable in such a way that data may permanently be stored.

A PMC memory cell is operated by selectively applying a positive or a negative voltage to the solid electrolyte of the PMC memory element. In order to store data in the PMC cell, the PMC memory cell is brought to a program state by applying a suitable program voltage to the PMC memory cell which results in the development of the conductive path in the electrolyte material and therefore in the setting of a first state with low resistance. In order to store a second state in which the PMC memory cell exhibits a high resistance, an erase voltage has to be applied in such a manner that the resistance of the PMC memory cell changes back to a high resistance, which is also referred to as an erased state. To read out a datum from a PMC memory cell, a read voltage, which is lower than the programming voltage, is applied to the PMC memory cell. With the read voltage, a current through the resistance of the PMC memory cell is detected and associated to a respective low resistance state or a high resistance state of the PMC memory cell.

Conventional programming circuits for a programmable microelectronic device are known. A programming circuit is configured to provide a reversible bias across the microelectronic device to perform erase and write functions. One configuration of the programming circuit includes one or more inputs and a complementary metal-oxide semiconductor (CMOS) circuit coupled to the programmable device. This design allows for writing and erasing of the programmable cell using a low and a high voltage input. Depending on the state that should be programmed to the PMC cell, a high voltage is applied to the anode and a low voltage is applied to the cathode or, reversely, a low voltage is applied to the anode and a high voltage is applied to the cathode of the PMC cell. However, voltage cross talk may occur between the high voltage level of a selected bit line, used for programming a selected PMC cell, and a non-selected (or floating) neighbouring bit line that could cause a programming failure.

SUMMARY OF THE INVENTION

The present invention provides a memory device with memory cells comprising resistive elements and a selective switch with an improved controlling of the voltages for reading data from the memory cell. A further embodiment of the present invention provides a memory with voltage levels that improve the reading of data from a memory cell with a resistive element and a selective switch. Furthermore, another embodiment of the present invention provides a memory with memory cells comprising resistive elements and a selective switch, with a first and a second bit line of a bit line pair that are connectable with a first and a second voltage level for attaining an improved memory retention. A further embodiment of the present invention provides an improved method for reading a datum from a memory cell of a memory, wherein the memory cell comprises a resistive element and a switch.

Another embodiment of the invention provides a method for reading a datum from a memory cell of a memory with an improved voltage level for the two bit lines of a bit line pair that is used for reading out the datum of the memory cell by a sense amplifier.

One embodiment of the present invention provides a memory device with memory cells, wherein each memory cell comprises a resistive element and a selective switch, wherein the memory cells are connected with a common plate line and with respective bit lines, wherein the common plate line delivers a plate voltage, wherein the switches comprise controlling inputs that are connected with word lines for controlling the switching states, wherein the word lines are connected with a word line driver that supplies to selected word lines a voltage, wherein the bit lines are connected with second switches, wherein the first bit lines are connectable by respective second switches with a first voltage level and the second bit lines are connectable by respective second switches with a second voltage level, wherein a first and a second bit line are connectable as a bit line pair with a sense amplifier, wherein the sense amplifier amplifies a voltage difference between the first and the second bit line of the bit line pair, wherein the resistive element is able to change the resistance depending on an electrical voltage that is applied across the resistive element, and wherein the second voltage level is between the plate voltage level and the first voltage level.

Another embodiment of the present invention provides a method for reading a data from a memory cell of a memory, wherein the memory comprises memory cells, wherein a memory cell comprises a resistive element and a cell switch, wherein the memory cells are connected with a common plate line and with respective bit lines, wherein the common plate line delivers a plate voltage, wherein the cell switches comprise controlling inputs that are connected with word lines for controlling a connection between the memory cell, the plate line and a bit line, wherein the word lines are connected with a word line driver that supplies to selected word lines a voltage, wherein the bit lines are connected with second switches, wherein first bit lines are connectable by the second switches with a first voltage level and second bit lines are connectable by the second switches with a second voltage level, wherein a first and a second bit line are connectable as a bit line pair with a sense amplifier, wherein the sense amplifier amplifies a voltage difference between the first and the second bit line of a bit line pair, wherein the resistive element is able to change the resistance depending on an electrical voltage that is applied across the resistive element, and wherein the first voltage level is between the plate voltage level and the second voltage level. At a first step, the first bit line is put on a first voltage level and the second bit line is put on a second voltage level. In a second step, the first bit line is connected by the cell switch with a first memory cell, wherein the voltage level of the first bit line is changed, or not changed, depending on the resistance of the resistive element, whereby the first and the second bit line are connected with the sense amplifier and the sense amplifier generates an output signal that depends on the ratio of the voltage levels of the two bit lines of the bit line pair.

The present invention provides an improved memory with memory cells comprising resistive elements and a selective switch with a simple circuit for writing and/or reading data from the memory cells. The present invention provides the advantage that conventional circuit arrangements of dynamic random access memory can be used, at least partially, for reading out and/or writing in data in the memory cells. This has the advantage that the input and/or the output of the memory device of the present invention may be modified from a conventional DRAM memory device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally relates to microelectronic devices. More particularly, the invention relates to programmable structures suitable for various integrated circuit applications, for example, in memory devices.

The present invention may be described in terms of various functional components. It should be appreciated that such functional components may be realized by any number of hardware or structural components configured to perform the specified functions. For example, the present invention may employ various integrated components comprised of various electrically devices, such as resistors, transistors, capacitors, diodes and such components, the behaviour of which may be suitably configured for various intended purposes. In addition, the present invention may be practised in any integrated circuit application where an effective reversible polarity is desired. Such general applications may be appreciated by those skilled in the art in light of the present disclosure are not described in detail. Further, it should be noted that various components may be suitably coupled or connected to other components within exemplary circuits, and that such connections and couplings can be realized by direct connection between components and by connections through other components and devices located in between.

Figure 1:
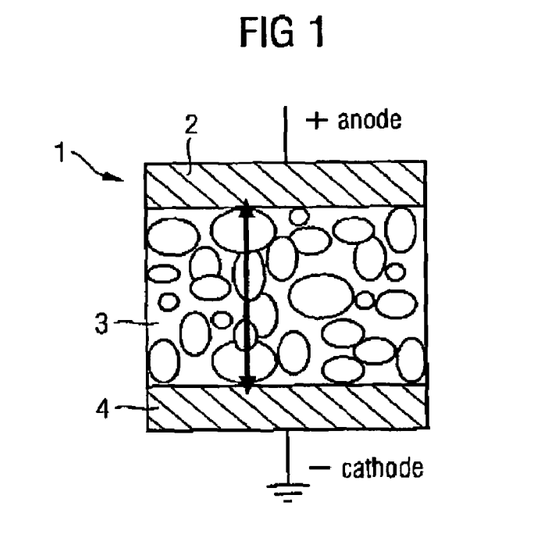
FIG. 1 is a schematic drawing of a resistive element.

In a schematic view, FIG. 1 depicts a resistive element 1 of a memory cell that comprises an anode 2, an electrolyte layer 3 and a cathode 4. The electrolyte layer is arranged between the anode 2 and the cathode 4. Depending on the embodiment, other materials or other structures may be used for realizing the resistive element.

The structure shown in FIG. 1 may be utilized to store information and thus may be used in memory circuits, for example, in random access memories. For example, the conductive bridging junction or other programmable structure in accordance with the present invention may be suitable for use in memory to replace DRAM, SRAM, PROM, EEPROM, Flash memories or any combination of such memories. In addition, programmable structures of the present invention may be utilized for other applications where programming or changing of electrical properties of a portion of an electrical circuit are desired.

The electrolyte layer 3 is formed by material that conducts ions upon application of a sufficient voltage. Suitable materials for ion conductors include polymers, glasses and semiconductor materials. In one exemplary embodiment of the invention, the electrolyte layer is formed by chalcogenides material. The chalcogenide material may comprise a chalcogene element, such as sulfur, selenium, tellurium combined with arsenic, germanium, phosphorus, and antimony. The electrolyte layer 3 may also suitably include dissolved and/or dispersed conductive material. For example, the electrolyte layer 3 may comprise a solid solution that includes dissolved metals and/or metal ions. The chalcogenide material may include silver, copper, and combinations of these materials, which could be used for constituting the electrolyte layer 3.

The anode 2 and the cathode 4 may be formed by any suitable conductive material. For example, the anode 2 and the cathode 4 may be formed by doped polysilicon material or metal. In accordance with an exemplary embodiment of the present invention, one of the electrodes, for example the anode 2, is formed by a material including a metal that dissolves into the ion conductor if a sufficient bias is applied across the anode and the cathode. The cathode 4 is formed by a metal that is relatively inert and does not dissolve during operation of the programmable device. The anode 2 may be an anode during a write operation and be comprised of a material including silver that dissolves in the electrolyte layer. The cathode 4 may be a cathode during the write operation and be comprised of an inert material such as tungsten, nickel, molybdenum, platinum, metal silicides and such like.

The electrolyte layer 3 constitutes a resistive element that is configured in such a way that when a bias larger than a threshold voltage is applied between the anode 2 and the cathode 4, the electrical properties of the electrolyte layer 3 changes. When a voltage larger than the threshold voltage is applied, conductive ions within the electrolyte layer start to migrate and form a region having an increased conductivity compared to the conductor head or near the cathode. As the conductive region forms, the resistance between the anode 2 and the cathode 4 decreases, and other electrical properties may also change. The reduced resistance defines a first programmed state. If the same voltage is applied in reverse, the conductive region will dissolve back in the electrolyte layer, and the device will turn to a high resistance state. In one embodiment, the low resistance state is a first state, and the high resistance state is a second state of the memory cell.

Figure 2:
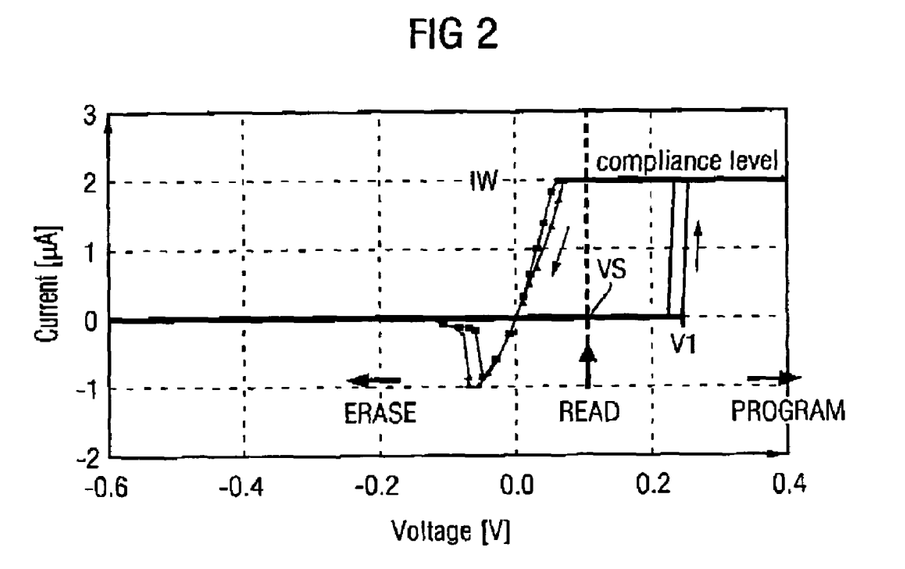
FIG. 2 is a diagram of voltages and currents for reading, programming and erase operations.

FIG. 2 shows a diagram of the voltage and the current during a programming operation, a read operation and an erase operation of a memory cell, wherein the program and the erase operation constitute write operations that are used to store data in a memory cell with a resistive element. The diagram shows the current on the axis of ordinates and the voltage between the anode and cathode on the axis of abscissa. At the start, the memory cell is not programmed and therefore the resistive element has a high resistance. If a voltage is applied with a high voltage at the anode 2 and the low voltage at the cathode 4, no current flows through the memory cell until a threshold voltage V1 is applied. With the voltage rising over the threshold voltage V1, current starts to flow until a working current IW is achieved that is confined by the programming circuit. The voltage is then reduced to 0 V, whereby the current falls to 0 A. Now the memory cell is programmed. This means that the resistive element of the memory cell is in a low resistance state.

If a program status is to be sensed or read, a sensing voltage VS is applied to the memory cell which is lower than the threshold voltage V1. In one embodiment as shown in FIG. 2, the sensing voltage VS may be about 0.1 V. Due to the sensing voltage, a working current IW flows through the memory cell. Without the program operation, no current would flow through the memory cell applied to a sensing voltage. To erase the program status, a lower voltage, such as a negative voltage, is applied to the anode 2 starting at 0 V. Up to a negative voltage of about −0.1 V, a negative current flows through the memory cell. When the negative voltage drops lower than −0.1 V, the current goes down to 0 A. Now the memory cell again has the same high resistance as prior to the program operation. This means that the resistive element of the memory cell is again in a high resistance state.

Figure 3:
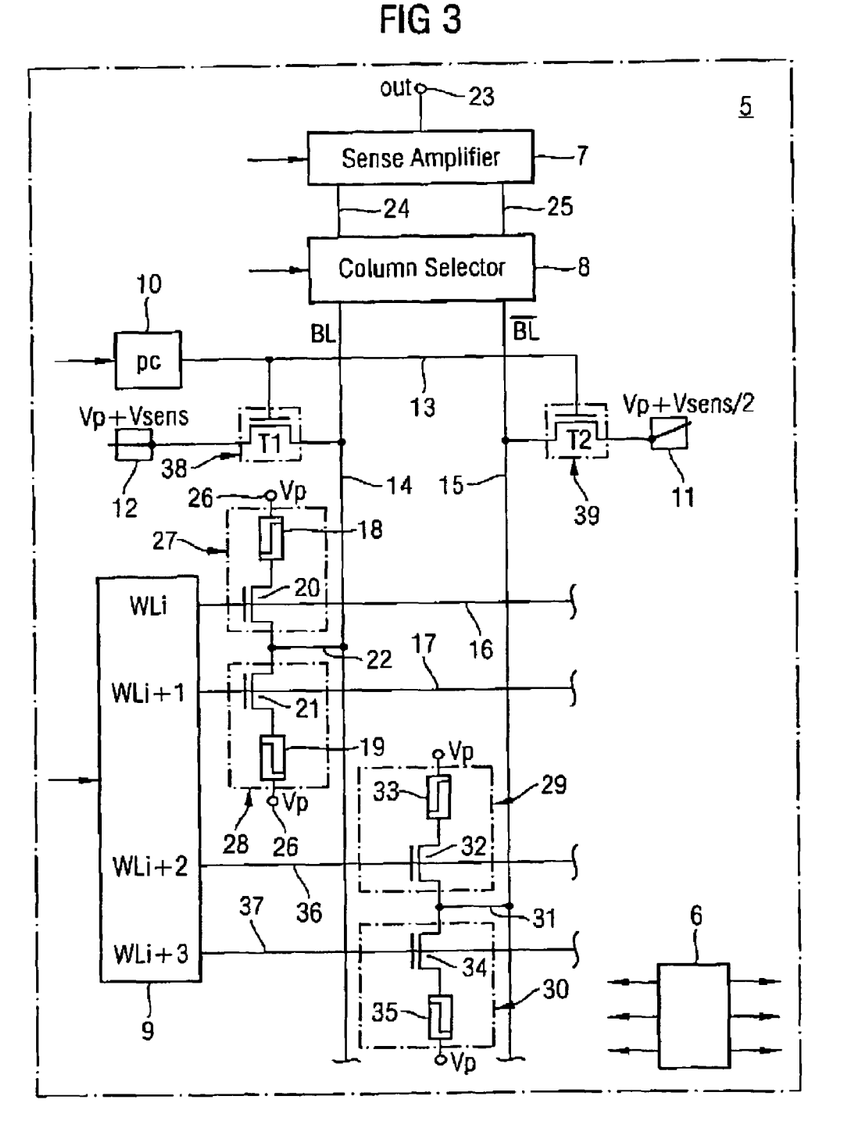
FIG. 3 is a schematic diagram illustrating a first embodiment of the memory device.

FIG. 3 shows a part of a memory device 5. The memory device 5 comprises a control unit 6, a sense amplifier 7, a column selector 8, a word line selector 9, and memory cells 27, 28. The memory device 5 comprises other circuits that are not necessary for the understanding of the invention and therefore not depicted and described. In the depicted section, a bit line pair comprising a first and a second bit line 14, 15 are arranged and are connected with the column selector 8. The first bit line 14 is connected by a connecting line 22 with a first memory cell 27 and a second memory cell 28. The first memory cell 27 comprises a first resistive element 18 and a first switch 20. The first resistive element 18 is configured in similar fashion as the resistive element 1 of FIG. 1. The first switch 20 is connected with the connecting line 22 and with an anode of the first resistive element 18. A cathode of the first resistive element 18 is connected with a plate potential 26. The first switch 20 is connected with a controlling input to a first word line 16. The first switch 20 is built as a field effect transistor which connects the first resistive element 18 with the connecting line 22 depending on the controlling voltage of the first word line 16.

The second memory cell 28 comprises a second switch 21 and a second resistive element 19. A cathode of the second resistive element 19 is connected with the plate potential 26, and an anode of the second resistive element 19 is connected by the second switch 21 with the connecting line 22. The second switch 21 comprises a controlling input that is connected with a second word line 17. Depending on the controlling voltage on the second word line 17, the second switch 21 connects the second resistive element 19 with the connecting line 22. Therefore, depending on the voltage level on the first and the second word lines 16, 17, the first or the second memory cell 27, 28 are respectively connected with the first bit line 14.

The second bit line 15 is connected by a second connecting line 31 with a third memory cell 29 and a fourth memory cell 30. The third memory cell 29 comprises a third switch 32 and a third resistive element 33. The fourth memory cell 30 comprises a fourth switch 34 and a fourth resistive element 35. The third switch 32 comprises a controlling input that is connected with a third word line 36. The fourth switch 34 comprises a controlling input that is connected with a fourth word line 37. The third and the fourth word lines 36, 37 are connected with the word line selector 9. The third and the fourth switches may be embodied as field effect transistors that electrically connect, depending on the voltage levels on the third and fourth word lines 36, 37, respectively, the third and the fourth resistive element 33, 35, respectively, with the second bit line 15.

Depending on the embodiment, the first and the second bit line 14, 15 may be connected with several pairs of memory cells that are designed similarly as the first and the second memory cells. The further memory cells may be connected with further word lines and connected with the plate potential 26 similarly to the first and second memory cells 27, 28.

The memory device 5 may comprise a plurality of bit line pairs that are not depicted but arranged and embodied in the same manner as the first and second bit lines 14, 15. The further bit line pairs are also connected with the column selector 8 and with further sense amplifiers.

The first bit line 14 is connected by a further switch 38 with a first potential source 12. The second bit line 15 is connected by a second further switch 39 with a second potential source 11. The further switch 38 and the second further switch 39 each comprise a controlling input that is connected by a controlling line 13 with a control switch 10. Depending on the output voltage of the control switch 10, the further and the second further switches 38, 39 respectively connect the first bit line 14 with the first potential source 12 and the second bit line 15 with the second potential source 11.

For a read operation, the first potential source 12 provides a potential that is a sensing voltage higher than the plate voltage 26. The sensing voltage is, for example, in the range of 0.1 V. Depending on the properties of the resistive element, the sensing voltage may be another value.

For the read operation, the second potential source 11 provides a potential that is, for example, half of the sensing voltage above the plate voltage 26. In one embodiment, during a read operation, the voltage of the second potential source 11 should be between the level of the plate voltage 26 and the level of the voltage of the first potential source 12.

In DRAM memories, the memory cells, the word lines and the bit lines are arranged in such a way in the memory array that an activated word line connects a memory cell to one bit line, while to the neighbouring bit lines no memory cell is connected (i.e., a folded bit line architecture). All the bit lines are equalized and precharged to the same voltage before a read operation. During a read operation, the selected memory cell increases or decreases the voltage of the connected bit line, while the voltage of the neighbouring bit line with no cell connected remains unchanged.

FIG. 3 shows a basic principle of a new voltage sensing concept according to one embodiment of the invention. In this new approach, the bit lines of a bit line pair that is used for deriving a program state of a memory cell by the sense amplifier are not equalized. At the start, the bit lines 14, 15 of the bit line pair are connected by the column selector 8 with the sense amplifier 7. The bit lines 14, 15 of the bit line pair are not connected with the respective memory cells 27, 29. According to the read operation, the control unit 6 controls the column selector 8 to connect the first and the second bit lines 14, 15 by a first and a second lines 24, 25, respectively, with the sense amplifier 7. Before a word line is activated, the first bit line 14 of the bit line pair is precharged to a first precharge voltage that is a sensing voltage ($V_{sense}$) higher than the plate voltage ($V_P$). The plate voltage 26 is the common voltage to which the memory cells are connected. The second bit line 15 is precharged to a second precharge voltage that is between the plate voltage 26 and the first precharge voltage. Preferably, the second precharge voltage is in the middle between the plate voltage ($V_P$) and the first precharge voltage ($V_P + V_{sense}$). For attaining the precharging of the first and the second bit lines 14, 15, the control unit 6 controls the control switch 10. The control switch 10 puts a voltage on the controlling line 13 that switches the first and the second further switches 38, 39 in a closed state. In the closed state, the further switch 38 and the second further switch 39 respectively connect the first bit line 14 with the first potential source 12 and the second bit line 15 with the second potential source 11. Thus, the first potential source 12 provides the first precharge voltage ($V_P + V_{sense}$) and the second potential source 11 provides the second precharge voltage ($V_P + (V_{sense}/2)$).

After the precharge operation, the first bit line 14 has a voltage level that is a sensing voltage higher than the plate voltage 26 of the memory cells. The second bit line 15 however has a voltage that is between the plate voltage 26 and the first precharge voltage (i.e., plate voltage plus sensing voltage). Preferably, after the precharge step, the second bit line 15 is on a voltage level that is in the middle between the plate voltage and the first precharge voltage. In a further process step, the further and the second further switches 38, 39 are switched in an open state, disconnecting respectively the first bit line 14 from the first potential source 12 and the second bit line 15 from the second potential source 11.

For selecting the first memory cell 27, the control unit 6 controls the word line selector 9 respectively to put a high voltage on the first word line 16 and low voltages to the second word line 17, the third word line 36 and the fourth word line 37. Accordingly, only the first switch 20 is switched in a closed state, and the second switch 21, the third switch 32 and the fourth switch 34 are in an open state. Therefore, the first resistive element 18 is connected with the first bit line 14. The second bit line 15 is connected to no memory cell.

Depending on the programmed state of the first memory cell 27, the first bit line 14 is discharged or not. If the first resistive element 18 of the first memory cell 27 is in a low resistive state, the voltage of the first bit line 14 will drop below the second precharge voltage (i.e., $V_P + (V_{sense}/2)$) within a certain time interval. If the first resistive element 18 of the first memory cell 27 is in a high resistive state, the voltage of the first bit line will remain at a level above the second precharge voltage.

The second bit line 15 of the bit line pair does not change its potential, because no memory cell is activated and connected with the second bit line. The second bit line 15 serves as a reference bit line for the sense amplifier 7. The sense amplifier 7 compares the voltage level of the first bit line 14 with the voltage level of the second bit line 15. Depending on the comparison, the sense amplifier 7 outputs a high voltage level on an output 23 if the first resistive element 18 of the first memory cell 27 is in a high resistance state and outputs a low level voltage if the first resistive element 18 of the first memory cell 27 is in a low resistive state.

Using the read operation, every memory cell may be read out, and a corresponding digital signal is output by the sense amplifier 7 according to the program state of the memory cell.

Figure 4:
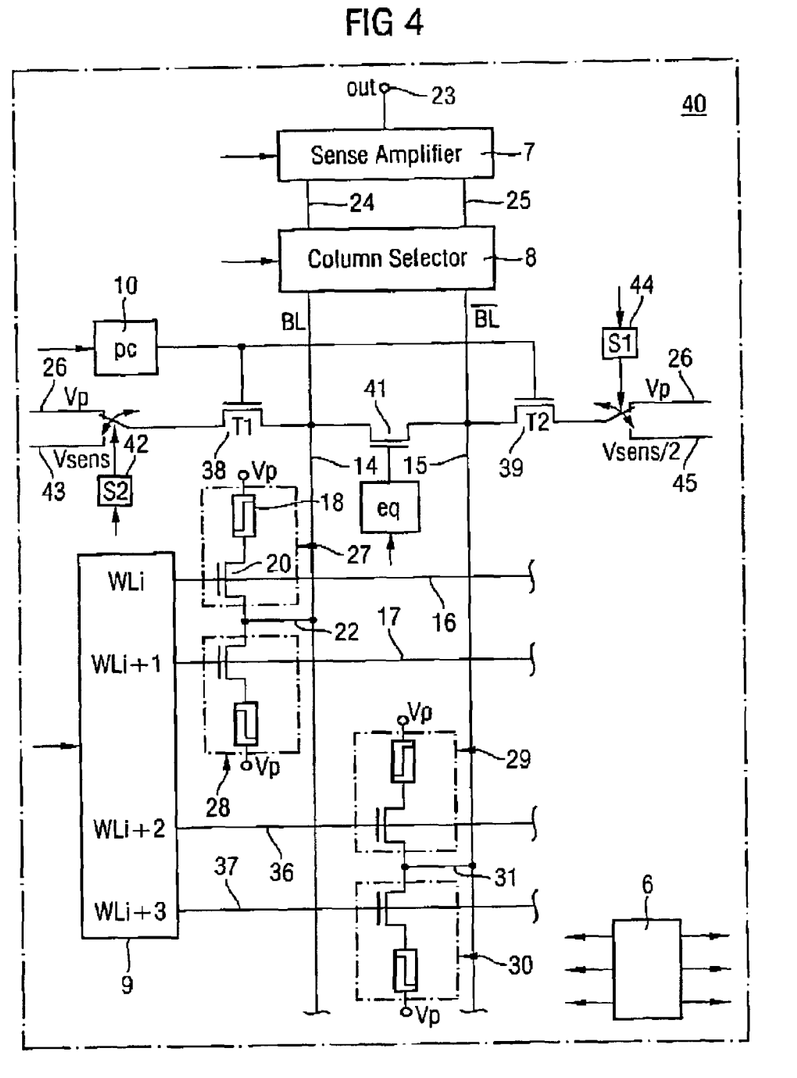
FIG. 4 is a schematic diagram illustrating a second embodiment of the memory device.

FIG. 4 depicts basically a second memory device 40 that is constructed similarly to the memory device 5 of FIG. 3. However, contrary to the memory device 5, the first and the second bit lines 14, 15 of the second memory device 40 are connected by a third further switch 41 that is also controlled by the control unit 6. The third further switch 41 selectively connects or disconnects, depending on the control voltage that is applied by the control unit 6 to an input of the third further switch 41, the first and the second bit lines 14, 15. Additionally, the further switch 38 is arranged between the first bit line 14 and a first selecting switch 42. The first selecting switch 42 is controlled by the control unit 6. The first selecting switch 42 is connected via a first input with the plate potential 26 and via a second input with a first precharge voltage source 43 that delivers a voltage that is a sensing voltage higher than the plate voltage 26. The selecting switch 42 selectively connects, depending on a controlling signal of the control unit 6, the further switch 38 with the plate voltage 26 or with the first precharge voltage source 43.

In contrast to the embodiment of the memory device 5 of FIG. 3, the second memory device 40 comprises a second selecting switch 44 that is arranged between the second further switch 39 and the plate potential 26 and a second precharge voltage source 45. The second precharge voltage source 45 provides a voltage that is between the plate voltage 26 and the first precharge voltage of the first precharge voltage source 43, preferably in the middle between the plate voltage 26 and the first precharge voltage. Depending on the control signal of the control unit 6, the second selecting switch 44 selectively connects the second further switch 39 with the plate potential 26 or with the second precharge voltage source 45.

For reading or sensing a program state of the first memory cell 27, the first and the second bit lines 14, 15 are connected by the column selector 8 with the sense amplifier 7. At this time, the first and the second bit lines 14, 15 are not connected with a memory cell. Then the first bit line 14 is connected by the further switch 38 and the selecting switch 42 with the plate potential 26. At the same time, the second bit line 15 is connected by the second further switch 39 and the second selecting switch 44 with the plate potential source 26. The first and the second bit lines 14, 15 are thus precharged with the plate voltage. The first and the second bit lines 14, 15 are connected and equalized by the third further switch 41. After the equalization of the voltage levels, the third further switch 41 is opened. Then the first bit line 14 is precharged by the first further switch 38 and the selecting switch 42 to the first precharge voltage Vsens. The second bit line 15 is precharged by the second further switch 39 and the selecting switch 44 to a second precharge voltage Vsens/2. Then the further switch 38 and the second further switch 39 are opened. After that, the first word line 16 is activated connecting the first memory cell 27 with the first bit line 14. At the second bit line 15, no memory cell is connected by the first word line 16.

Thereafter, the resistive state of the resistive element 18 of the first memory cell is sensed by the first bit line 14. Depending on the resistive state of the first resistive element 18, the voltage of the first bit line 14 is (or is not) lowered from the first precharge voltage to a voltage below the second precharge voltage (i.e. Vp+(Vsense/2)) within a certain time interval. If the first resistive element 18 is in a low resistive state, the voltage of the first bit line 14 drops below the second precharge voltage level. If the first resistive element 18 is in a high resistive state, the voltage of the first bit line will remain at a level above the second precharge voltage.

The column selector 8 is controlled by the control unit 6 to forward the voltage of the first bit line 14 by the first line 24 and the voltage of the second bit line 15 by the second line 25 to the sense amplifier 7. The sense amplifier 7 amplifies the voltage difference between the first and second lines 24, 25 that correspond to the voltage difference between the first and the second bit lines 14, 15. In one embodiment, the sense amplifier 7 outputs a high level signal on the output 23 if the first resistive element 18 is in a high resistance state. The sense amplifier 7 outputs a low level signal if the first resistive element 18 is in a low resistance state. Therefore, the signal on the output 23 depends on the program state of the first memory cell 27.

Depending on the embodiment, the plate voltage of the plate voltage source 26 may be higher than the first and the second precharge voltage of the first and the second bit lines 14, 15. In this case, the bit line with the selected memory cell will increase its voltage level during read operation. A suitable precharge condition would be to charge the second bit line 15 to a second precharge level that is half the sensing voltage lower than the plate potential. The first bit line 14 should be charged to a precharge voltage that is a sensing voltage lower than the plate potential.

Figure 5:
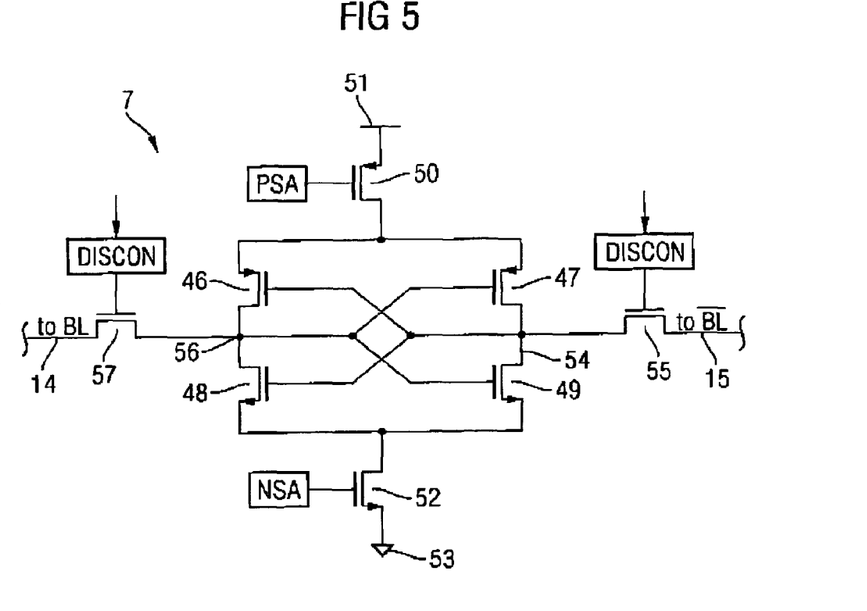
FIG. 5 is a schematic diagram illustrating a first embodiment of a sense amplifier.

FIG. 5 depicts a sense amplifier 7 of a DRAM as known in the state of art that may be used as sense amplifier 7 with the function of the column selector 8 as depicted in FIGS. 3 and 4. The sense amplifier 7 comprises a first p-FET 46 and a second p-FET 47, wherein the first p-FET 46 is arranged in series with a first n-FET 48 and the second p-FET 47 is arranged in series with a second n-FET 49. Source terminals of the p-FETs 46, 47 are connected and connectable by a further p-FET 50 connectable to high potential source 51. Source terminals of the n-FETs 48, 49 are connected together and connectable by a further n-FET 52 with a low potential source 53. The gate terminals of the first n-FET transistor and the first p-FET transistor that are connected in series are connected together and connected with a connecting line 54 between the second p-FET transistor 47 and a second n-FET transistor 49. Additionally, the connecting line 54 is connected by a third further FET 55 with the second bit line 15. The gate terminals of the second p-FET transistor 47 and the second n-FET transistor 49 are connected together and connected with a further connecting line 56 that connects the first p-FET transistor 46 and the first n-FET transistor 48. The second connecting line 56 is connecting by a fourth further FET 57 with the first bit line 14.

The further, the second further, the third further and the fourth further FET transistors 50, 52, 55, 57 are controlled by the control unit 6. The control unit 6 operates the sense amplifier 7 as follows:

Firstly, a PSA signal with a high voltage level is put on the gate of the further p-FET 50, and a NSA signal with a low voltage level is put on the gate of the further n-FET 52, deactivating a latching by the sense amplifier 7.

At the same time, a DISCON signal with a high voltage level is put on the gate of the fourth further FET 57 and on the gate of the third further FET 55, connecting the first and second bit lines with the sense amplifier. The third and the fourth further FET 55, 57 constitute an amplifier control unit.

After activating the first word line 16, the selected first memory cell 27 changes the voltage on the first bit line 14 as explained above during a reading process. Therefore, the voltage on the second connecting line 56 is also changed.

Then the DISCON signals are put on a low voltage causing the amplifier control unit 6 to disconnect the bit lines 14, 15 from the sense amplifier 7. The value of the voltages of the bit lines are stored in the sense amplifier 7.

In a following step, the PSA signal is put on a low voltage level and the NSA signal is put on a high voltage level. The sense amplifier 7 amplifies the stored voltages of the bit lines and generates a digital output signal. The amplified voltages are not put back on the bit lines, because the third and the fourth further FET are in an open state.

The control unit 6 controls the further, the second further, the third further and the fourth further FET transistors 50, 52, 55, 57 to read out a data of a memory cell, whereby the first bit line 14 and the second bit line 15 are disconnected after transferring enough voltage to the sense amplifier 7 so that the sense amplifier 7 is able to amplify the voltage difference between the first bit line 14 and the second bit line 15. Thus, a higher voltage on the first and the second bit line 14, 15 which is fed back from the sense amplifier is prevented.

This is necessary to prevent an erasing or an unintended writing of data in the memory cell.

Figure 6:
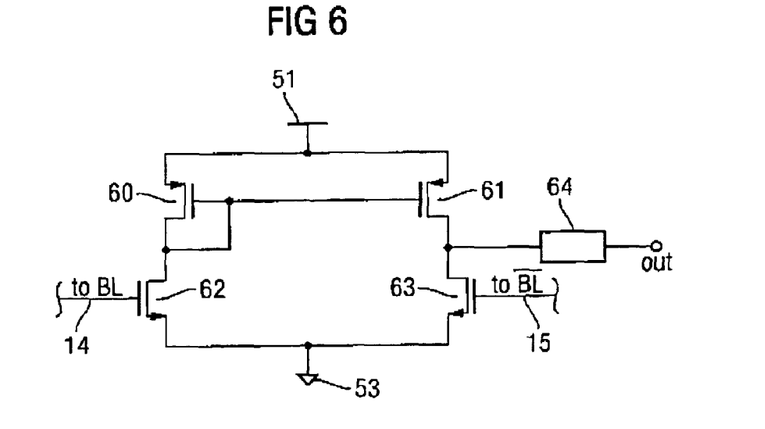
FIG. 6 is a schematic diagram illustrating a second embodiment of a sense amplifier.

Instead of the well known sense amplifier of FIG. 5, FIG. 6 depicts a further, simple differential input comparator circuit as a second sense amplifier as known in the state of art. The second sense amplifier of FIG. 6 comprises two parallel arranged further p-FET transistors 60, 61 and two parallel arranged further n-FET transistors 62, 63. The first further p-FET transistor 60 is arranged in series to the first further n-FET transistor 62. The second further p-FET transistor 61 is arranged in series with the second further n-FET transistor 63. The gate terminals of the first and the second p-FET transistor 60, 61 are connected together and additionally connected with a connecting line between the first further p-FET transistor 60 and the first further n-FET transistor 62. The source terminals of the first and second further p-FET transistors 60, 61 are connected with a high potential source 51. The source terminals of the first and the second further n-FET transistors 62, 63 are connected together and connected with a low potential source 53. The gate terminal of the first further n-FET transistor 62 is connected with the first bit line 14. The gate terminal of the second further n-FET transistor 63 is connected with the second bit line 15. The connecting line between the second further p-FET transistor 61 and the second further n-FET transistor 63 is connected with an output stage 64.

In a further embodiment, a sense amplifier as shown in FIG. 6 may be utilized. In a further embodiment, a sense amplifier as shown in FIGS. 5 and 6 may be utilized without a column selector, because a feedback from the sense amplifier 7 to the first and second bit lines 14, 15 is prevented.

The output stage 64 delivers a high or a low level signal depending on the voltage difference between the first bit line 14 and the second bit line 15. The sense amplifier as depicted in FIG. 6 is a feedbackless sense amplifier that may be used as a sensing amplifier of the memory device 5 of FIG. 3 or the second memory device 40 of FIG. 4.

While the foregoing is directed to embodiments of the present invention, other and further embodiments of the invention may be devised without departing from the basic scope thereof, and the scope thereof is determined by the claims that follow.

What is claimed is:

1. A memory apparatus, comprising:
 a plurality of memory cells, wherein each memory cell is connected with a common plate line supplying a plate voltage and with one of a plurality of bit lines, wherein each memory cell comprises:
  a resistive element having a programmable resistance and having a first terminal coupled to the common plate line; and
  a cell switch comprising a control input coupled to a word line for controlling a switching state of the cell switch, wherein the cell switch couples a second end of the resistive element to a respectively coupled bit line when switched-on;
 a first bit line of a bit line pair connectable to a first voltage level;
 a second bit line of the bit line pair connectable to a second voltage level, wherein the second voltage level is between the plate voltage level and the first voltage level; and
 a sense amplifier connectable to the first and second bit lines and amplifying a voltage difference between the first and second bit lines.

2. The apparatus of claim 1, wherein the sense amplifier comprises a first input and a second input respectively coupled to the first and second bit lines, wherein the sense amplifier provides an output signal based on the voltage difference between the first and second bit lines, wherein the output signal is transferred to an output of the sense amplifier, and wherein amplified voltages of the first and second inputs are not put back to the first and second bit line.

3. The apparatus of claim 1, further comprising:
a control unit which, when activated, respectively connects the first and second bit lines of the bit line pair to the first and second voltage levels.

4. The apparatus of claim 3, wherein the sense amplifier comprises a first input and a second input respectively coupled to the first and second bit lines, wherein the sense amplifier provides an output signal based on the voltage difference between the first and second bit lines, wherein the output signal is transferred to an output of the sense amplifier, and wherein amplified voltages of the first and second inputs are not put back to the first and second bit line.

5. The apparatus of claim 1, further comprising:
a switch disposed between and controllable to couple the first and second bit lines to one other.

6. The apparatus of claim 5, wherein the sense amplifier comprises a first input and a second input respectively coupled to the first and second bit lines, wherein the sense amplifier provides an output signal based on the voltage difference between the first and second bit lines, wherein the output signal is transferred to an output of the sense amplifier, and wherein amplified voltages of the first and second inputs are not put back to the first and second bit line.

7. The apparatus of claim 1, further comprising:
an amplifier control unit coupled to the sense amplifier and to a column selector for selecting the bit line pair, wherein the amplifier control unit disconnects the first and second bit lines of the bit line pair from the sense amplifier after the sense amplifier has been charged by respective potentials of the first and second bit lines of the bit line pair.

8. The apparatus of claim 7, wherein the sense amplifier is connectable to the first and second bit lines of the bit line pair via a plurality of switches, and wherein the amplifier control unit switches off the plurality of switches when an amplified voltage on at least one of the first bit line and the second bit line deviates from a given voltage range compared to the plate voltage.

9. The apparatus of claim 1, wherein the second voltage level differs from the plate voltage level in a voltage range for reading a program state of the resistive element.

10. The apparatus of claim 1, wherein the resistive element comprises a programmable metallization cell.

11. A method for reading data from a memory cell of a memory device, comprising:
providing the memory cell connected with a common plate line supplying a plate voltage and with a first bit line of a bit line pair, the memory cell comprising:
a resistive element having a resistance which is programmable based on an electrical voltage applied across the resistive element, the resistive element having a first terminal connected to the common plate line; and
a cell switch comprising a control input connected with a word line for controlling a switching state of the cell switch, wherein the cell switch connects a second end of the resistive element to the first bit line when switched-on;
charging the first bit line of the bit line pair to a first voltage level;

charging a second bit line of the bit line pair to a second voltage level, wherein the second voltage level is between the plate voltage level and the first voltage level; and
connecting the first bit line to the memory cell, wherein a voltage level of the first bit line is selectively changed depending on a resistance of the resistive element of the memory cell; and
amplifying a voltage difference between the first bit line and the second bit line of the bit line pair utilizing a sense amplifier connected to the first bit line and the second bit line of the bit line pair.

12. The method of claim 11, further comprising:
precharging the first and the second bit line to a common precharge voltage before respectively charging the first bit line and the second bit line to the first and second voltage levels.

13. The method of claim 11, further comprising:
connecting the first bit line and the second bit line during precharging and during a time period prior to respectively charging the first and the second bit lines to the first and second voltage levels.

14. The method of claim 13, wherein the second voltage level differs from a plate voltage level in a range for reading a program state of the memory cell.

15. A semiconductor memory device, comprising:
a plurality of word lines;
a plurality of bit lines;
a plurality of memory cells, each memory cell comprising:
a programmable resistive cell having a first terminal connected to a plate voltage, the programmable resistive cell having a sensing voltage for reading a resistance value of the programmable resistive cell; and
a cell switch having a control input connected to one of the word lines which, when activated by the connected word line, connects the programmable resistive cell to a first bit line of a bit line pair;
a first switch selectively connecting a first voltage level to the first bit line, wherein the first voltage level is higher than the plate voltage by the sensing voltage;
a second switch selectively connecting a second voltage level to a second bit line of the bit line pair, wherein the second voltage level is between the plate voltage and the first voltage level; and
a sense amplifier connected to the first and second bit lines of the bit line pair, the sense amplifier amplifying a voltage difference between the first bit line and the second bit line of the bit line pair.

16. The semiconductor memory device of claim 15, further comprising:
a control unit selectively activating the cell switch, the first switch and the second switch.

17. The semiconductor memory device of claim 16, further comprising:
a third switch connected between the first and second bit lines, wherein the control unit to switches-on the third switch to equalize the charges on the first and second bit lines in a precharge period before a read operation.

18. The semiconductor memory device of claim 17, wherein the first and second switches are further switchably connect the first and second bit lines to the plate voltage during the precharge period.

19. The semiconductor memory device of claim 15, wherein the second voltage level is halfway between the plate voltage and the first voltage level.

* * * * *